United States Patent
Ikejiri

(10) Patent No.: US 7,847,632 B2
(45) Date of Patent: Dec. 7, 2010

(54) SHORT-CIRCUIT DETECTING CIRCUIT

(75) Inventor: Hideo Ikejiri, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/506,404

(22) Filed: Jul. 21, 2009

(65) Prior Publication Data

US 2010/0019775 A1    Jan. 28, 2010

(30) Foreign Application Priority Data

Jul. 28, 2008 (JP) .............................. 2008-193666

(51) Int. Cl.
*H03F 3/217* (2006.01)
(52) U.S. Cl. ............... 330/251; 330/207 A; 330/207 P; 330/298
(58) Field of Classification Search .................. 330/10, 330/207 A, 251, 207 P, 298; 324/537
See application file for complete search history.

(56) References Cited

U.S. PATENT DOCUMENTS 7,327,187 B2 * 2/2008 Lee ............................. 330/10
7,586,369 B2 * 9/2009 Kobayashi et al. ............ 330/10

FOREIGN PATENT DOCUMENTS

JP    2007-235526    9/2007

* cited by examiner

*Primary Examiner*—Hieu P Nguyen
(74) *Attorney, Agent, or Firm*—Volentine & Whitt, PLLC

(57) ABSTRACT

A short-circuit detecting circuit which can accurately detect an output short-circuit of a class-D amplifier by a simple circuit construction. Two comparison pulse signals are formed on the basis of predetermined generating threshold values and a signal level of each of two output stage input pulse signals which are formed on the basis of an input pulse signal to the class-D amplifier and are supplied to an output stage of the class-D amplifier. A signal level of an output pulse from the class-D amplifier in a period of time corresponding to a pulse width of each of the comparison pulse signals is compared with a predetermined detection threshold values. A short-circuit detection signal is outputted in accordance with obtained level comparison results.

17 Claims, 11 Drawing Sheets

FIG. 3

| V1 | DIN | CH |
|----|-----|----|
| H  | H   | L  |
| H  | L   | H  |
| L  | H   | H  |
| L  | L   | H  |

FIG. 4

| V2 | DIN | CL |
|----|-----|----|
| H  | H   | L  |
| H  | L   | L  |
| L  | H   | L  |
| L  | L   | H  |

FIG. 5

| CL | DOUT | JL |
|----|------|----|
| H  | H    | L  |
| H  | L    | H  |
| L  | H    | H  |
| L  | L    | H  |

FIG. 6

| CH | DOUT | JH |
|----|------|----|
| H  | H    | L  |
| H  | L    | L  |
| L  | H    | L  |
| L  | L    | H  |

FIG. 7

| DIN | DOUT | JL | JH | V3 | V4 | DT |
|-----|------|----|----|----|----|----|
| H   | H    | H  | L  | L  | H  | L  |
| H   | L    | H  | H  | L  | L  | H  |
| L   | H    | L  | L  | H  | L  | H  |
| L   | L    | H  | L  | L  | H  | L  |

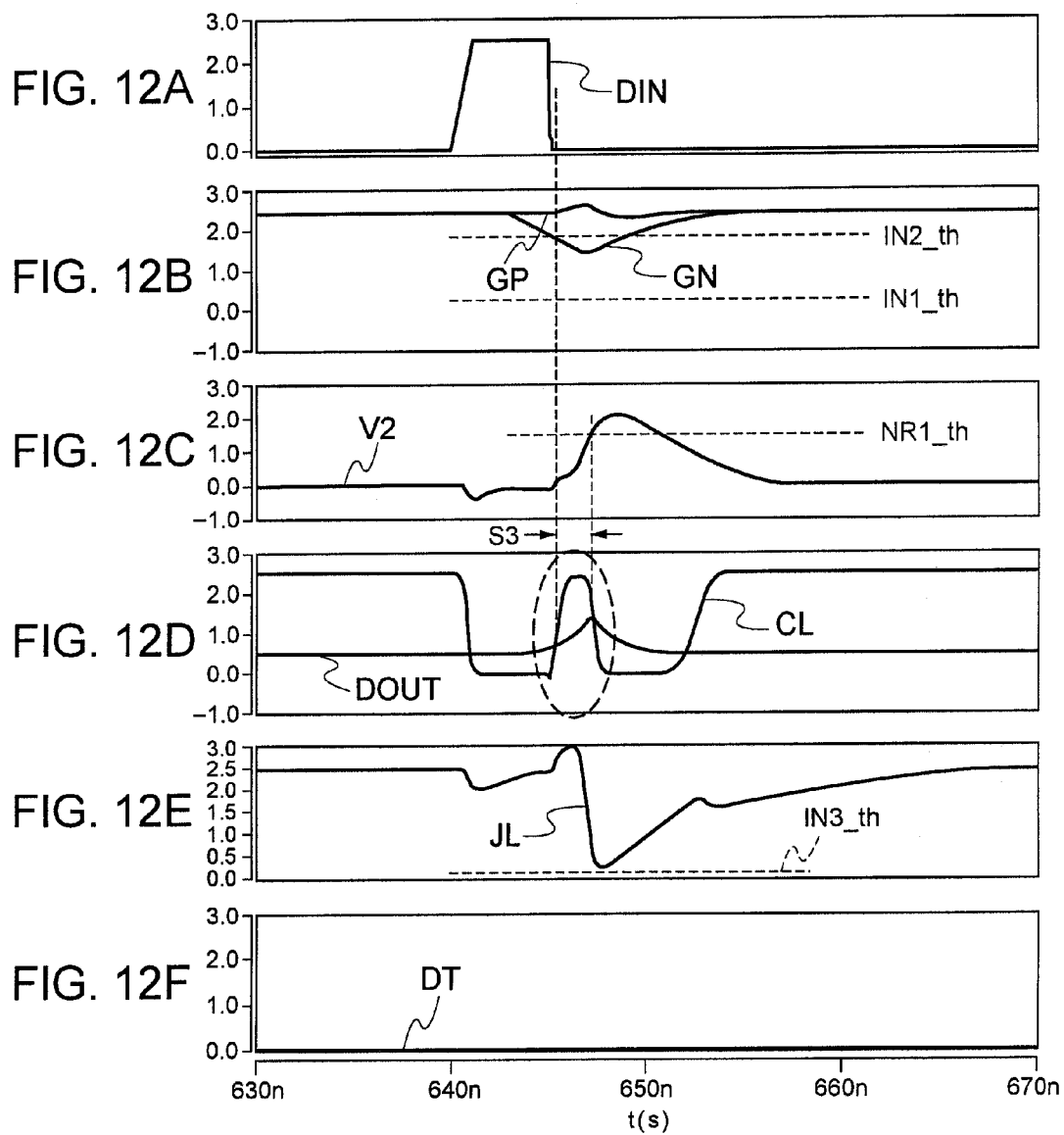

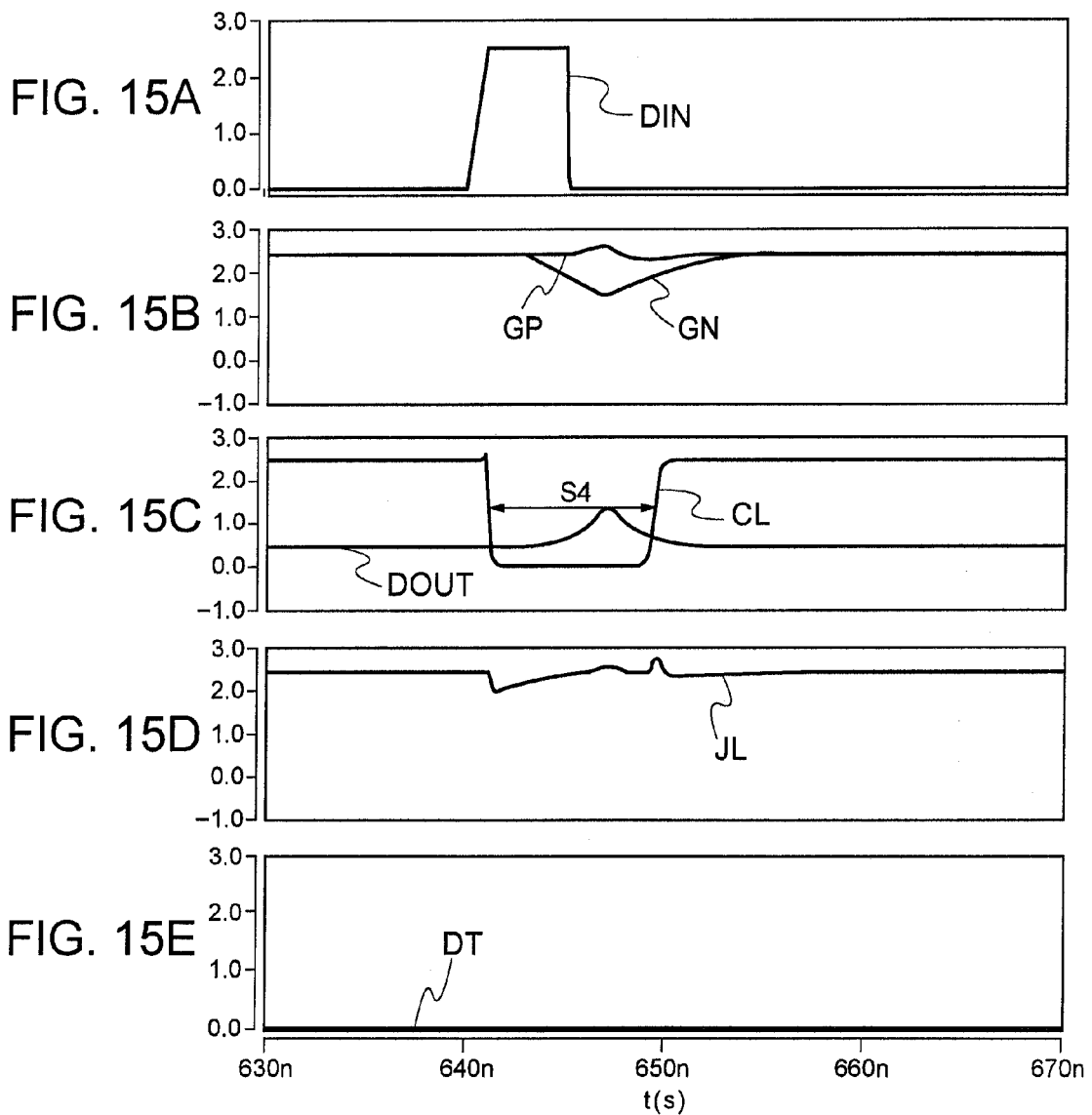

SHORT-CIRCUIT DETECTING CIRCUIT

BACKGROUND OF THE INVENTION

1. Field of the Invention

The invention relates to a short-circuit detecting circuit for detecting an output short-circuit of a class-D amplifier.

2. Description of the Related Art

In recent years, class-D amplifying circuits using a pulse width modulation system or the like are used in the field such as audio equipment. When an output of the class-D amplifying circuit is short-circuited, an apparatus such as a loudspeaker connected to the output or the class-D amplifying circuit itself is damaged. It is, therefore, necessary to detect the short-circuit of the output. For example, a pulse modulating type power amplifier for discriminating the short-circuit of the output from a state of an output signal and stopping the switching operation at the time of the output short-circuit, has been disclosed in Japanese patent Kokai No. 2007-235526 (Patent Document 1).

Since the class-D amplifying circuit is a simple buffer, it is ordinarily expected that a signal level of its output signal is the same as a signal level of an input signal. When an excessive current flows to the output of the class-D amplifying circuit due to the output short-circuit, however, a driving ability reaches a limit and the expected signal level is not outputted. In such a case, there is such a tendency that when it is expected that the output signal is at the high level, it is set to the low level, and when it is expected that the output signal is at the low level, it is set to the high level. In the short-circuit detecting circuit in the related art, by using the above tendency, the input signal and the output signal are monitored by an XOR (exclusive OR) circuit and, when the signal levels of both signals do not coincide, the short-circuit is detected.

In the class-D amplifying circuit in the related art, in order to prevent an excessive lead-through current from occurring in itself, an Hi-Z (high impedance) interval generating circuit is used, thereby setting the output upon transition of the signal level to Hi-Z.

SUMMARY OF THE INVENTION

In the arrangement as mentioned above, however, since the level of the output signal is uncertain in the interval of Hi-Z, according to the short-circuit detection based on only the comparison of the signal levels using the simple XOR circuit, the short-circuit is erroneously detected in the Hi-Z interval. Also when the signal level is shifted from the state of Hi-Z to the high level or the low level, since it takes a certain time to charge an input gate capacitor of an output buffer of the class-D amplifier, the signal level of the output signal in the interval is equal to a level between the high level and the low level. Even after the Hi-Z state has been cancelled, the short-circuit is erroneously detected for a little while. There is also a method whereby a clock signal and a counter circuit are used and the comparison of the signal levels is not performed in the transition interval of the signal level (masked in the transition interval), thereby preventing the erroneous detection. In this case, however, a circuit construction becomes complicated and an area to construct the circuit has to be assured, so that a chip area increases.

The invention has been made in consideration of the problem as mentioned above and it is an object to provide a short-circuit detecting circuit which can accurately detect an output short-circuit of an amplifying circuit by a simple circuit construction.

According to the invention, there is provided a short-circuit detecting circuit for detecting an output short-circuit of a class-D amplifier including an output stage input pulse signal generating part for generating two output stage input pulse signals on the basis of an amplifier input pulse signal and an output part for generating an output pulse signal on the basis of inputs of the two output stage input pulse signals, comprising: a comparison pulse generating part for comparing a signal level of one of the two output stage input pulse signals with a high-level generating threshold value and comparing a signal level of the other one of the two output stage input pulse signals with a low-level generating threshold value, thereby generating two comparison pulse signals; a pulse level comparing part for comparing a signal level of the output pulse signal from the class-D amplifier within a period of time corresponding to a pulse width of each of the two comparison pulse signals with a high-side detection threshold value and a low-side detection threshold value, thereby obtaining level comparison results; and a short-circuit detection signal output part for generating a short-circuit detection signal in accordance with the level comparison results.

According to the short-circuit detecting circuit of the invention, the output short-circuit of the amplifying circuit can be accurately detected by a simple circuit construction.

BRIEF DESCRIPTION OF THE DRAWINGS

FIG. 3 is a truth value table of a NAND circuit ND1;

FIG. 4 is a truth value table of a NOR circuit NR1;

FIG. 5 is a truth value table of a NAND circuit ND2;

FIG. 6 is a truth value table of a NOR circuit NR2;

FIG. 7 is a diagram showing a truth value table of the short-circuit detecting circuit;

FIGS. 12A to 12F are diagrams showing simulation results of the signals in the short-circuit detecting circuit of the second embodiment in the case where a pulse width of an amplifier input pulse signal DIN is short;

FIGS. 15A to 15E are diagrams showing simulation results of the signals in the short-circuit detecting circuit of the third embodiment.

DETAILED DESCRIPTION OF THE PREFERRED EMBODIMENTS

Embodiments according to the invention will be described in detail below with reference to the drawings.

First Embodiment

Figure 1:
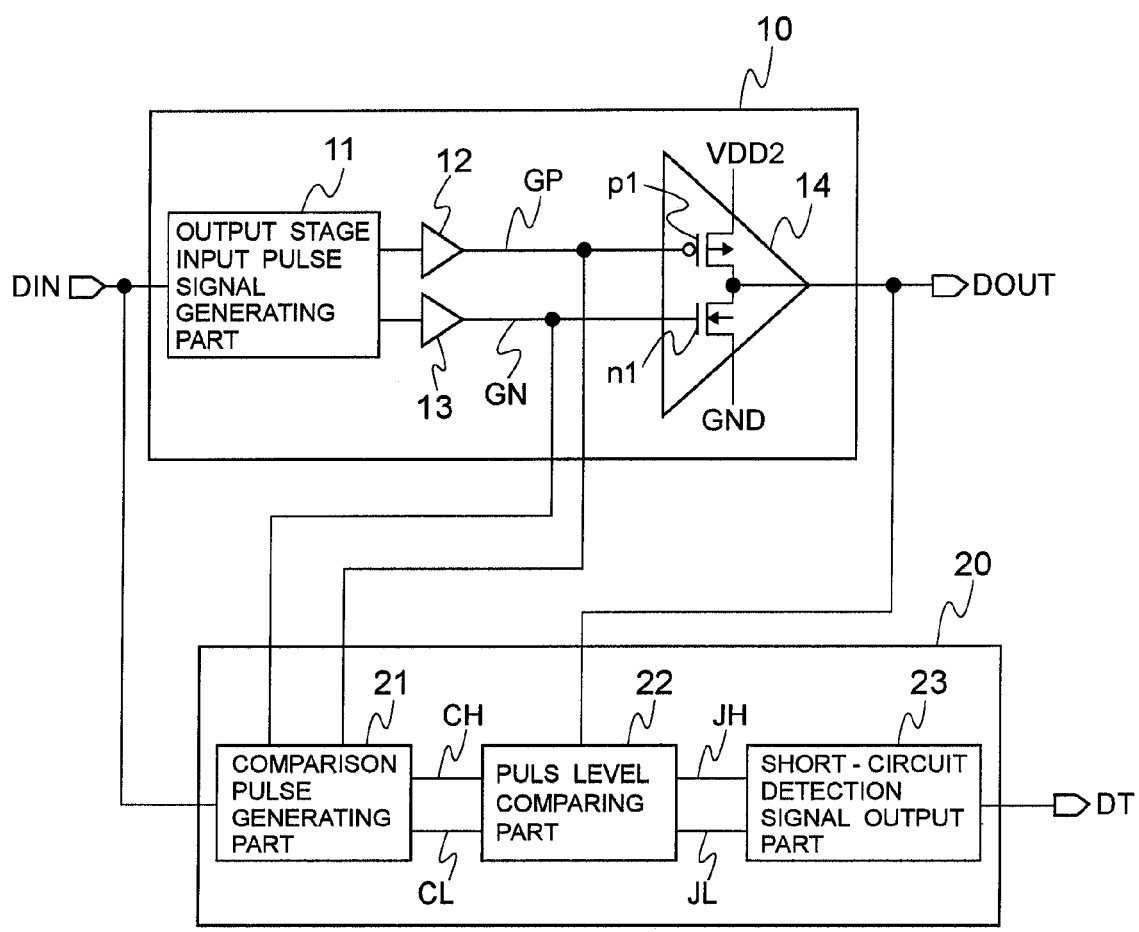
FIG. 1 is a block diagram showing a short-circuit detecting circuit of an embodiment together with a class-D amplifying circuit.

FIG. 1 is a block diagram showing a short-circuit detecting circuit 20 of the embodiment together with a class-D amplifier 10.

The class-D amplifier 10 is a class-D amplifier including: an output stage input pulse signal generating part 11; predrivers 12 and 13; and an output part 14. The class-D amplifier 10 amplifies an amplifier input pulse signal DIN and generates an output pulse signal DOUT.

The output stage input pulse signal generating part 11 generates two output stage input pulse signals on the basis of the amplifier input pulse signal DIN. Between the two output stage input pulse signals, the signal which is sent to the predriver 12 is called a Pch-side pulse signal GP and the signal which is sent to the predriver 13 is called an Nch-side pulse signal GN hereinafter, respectively.

The output stage input pulse signal generating part 11 generates the Pch-side pulse signal GP and the Nch-side pulse signal GN which are obtained by inverting a signal level of the amplifier input pulse signal DIN. In order to avoid an influence of the lead-through current, ordinarily, the output stage input pulse signal generating part 11 delays the input signal so as not to cause a state where a signal level of the Nch-side pulse signal GN is set to the high level and a signal level of the Pch-side pulse signal GP is set to the low level. In other words, the output stage input pulse signal generating part 11 delays a trailing edge of the Pch-side pulse signal GP from a leading edge of the amplifier input pulse signal DIN, generates the delayed signal, and generates a trailing edge of the Nch-side pulse signal GN synchronously with a trailing edge of the amplifier input pulse signal DIN. A pulse width of the Pch-side pulse signal GP and a pulse width of the Nch-side pulse signal GN are, thus, different. If the influence of the lead-through current is not considered, it is not always necessary that the pulse width of both of those signals differ.

The predriver 12 drives the Pch-side pulse signal GP from the output stage input pulse signal generating part 11 and supplies to a gate of a PMOS circuit p1 of the output part 14. The predriver 13 drives the Nch-side pulse signal GN from the output stage input pulse signal generating part 11 and supplies to a gate of an NMOS circuit n1 of the output part 14.

The output part 14 is an inverter of a CMOS circuit constructed by the PMOS circuit p1 and the NMOS circuit n1. The PMOS circuit p1 corresponds to the so-called Pch side of the CMOS circuit. The NMOS circuit n1 corresponds to the so-called Nch side of the CMOS circuit. A source of the PMOS circuit p1 is connected to a power voltage VDD2 and a drain is connected to a drain of the NMOS circuit n1. The Pch-side pulse signal GP is supplied to the gate of the PMOS circuit p1. A source of the NMOS circuit n1 is connected to a ground voltage GND and the drain is connected to the drain of the PMOS circuit p1. The Nch-side pulse signal GN is supplied to the gate of the NMOS circuit n1. The output pulse signal DOUT is outputted from a connecting point of the drain of the PMOS circuit p1 and the drain of the NMOS circuit n1.

The short-circuit detecting circuit 20 includes a comparison pulse generating part 21, a pulse level comparing part 22, and a short-circuit detection signal output part 23 and is a circuit for detecting an output short-circuit of the class-D amplifier 10. The output short-circuit is one of a short-circuit between the outputs, a short-circuit between the output and the ground, and a short-circuit between the output and a power source. Although the short-circuit detecting circuit 20 may be constructed as a single apparatus, it is typically formed in a semiconductor chip.

The comparison pulse generating part 21 generates two comparison pulse signals on the basis of the Pch-side pulse signal GP, Nch-side pulse signal GN, and amplifier input pulse signal DIN. One of the comparison pulse signals is called an H-side comparison pulse signal CH and the other is called an L-side comparison pulse signal CL.

In more detail, the comparison pulse generating part 21 generates the L-side comparison pulse signal CL having a pulse width WL corresponding to a period of time during which the signal level of the Nch-side pulse signal GN exceeds a predetermined high-level generating threshold value and the signal level of the amplifier input pulse signal DIN is at the low level. The comparison pulse generating part 21 also generates the H-side comparison pulse signal CH having a pulse width WH corresponding to a period of time during which the signal level of the Pch-side pulse signal GP is lower than a predetermined low-level generating threshold value and the signal level of the amplifier input pulse signal DIN is at the high level. The formed H-side comparison pulse signal CH and the formed L-side comparison pulse signal CL are supplied to the pulse level comparing part 22.

The pulse level comparing part 22 compares the signal level of the output pulse signal DOUT from the class-D amplifier 10 with a predetermined detection threshold value only within a period of time corresponding to the pulse width WH of the H-side comparison pulse signal CH and the pulse width WL of the L-side comparison pulse signal CL, thereby obtaining level comparison results.

In more detail, the pulse level comparing part 22 compares the signal level of the output pulse signal DOUT from the class-D amplifier 10 with a predetermined high-side detection threshold value within a period of time corresponding to the pulse width WH of the H-side comparison pulse signal CH, thereby obtaining an H-side comparison result signal JH. The pulse level comparing part 22 compares the signal level of the output pulse signal DOUT with a predetermined low-side detection threshold value within a period of time corresponding to the pulse width WL of the L-side comparison pulse signal CL, thereby obtaining an L-side comparison result signal JL. The H-side comparison result signal JH and the L-side comparison result signal JL are supplied to the short-circuit detection signal output part 23.

The short-circuit detection signal output part 23 generates a short-circuit detection signal DT in response to the H-side comparison result signal JH and the L-side comparison result signal JL. In more detail, when the H-side comparison result signal JH indicates that the signal level of the output pulse signal DOUT is lower than the high-side detection threshold value, the short-circuit detection signal output part 23 generates the short-circuit detection signal. When the L-side comparison result signal JL indicates that the signal level of the output pulse signal DOUT is higher than the low-side detection threshold value, the short-circuit detection signal output part 23 generates the short-circuit detection signal DT.

Figure 2:
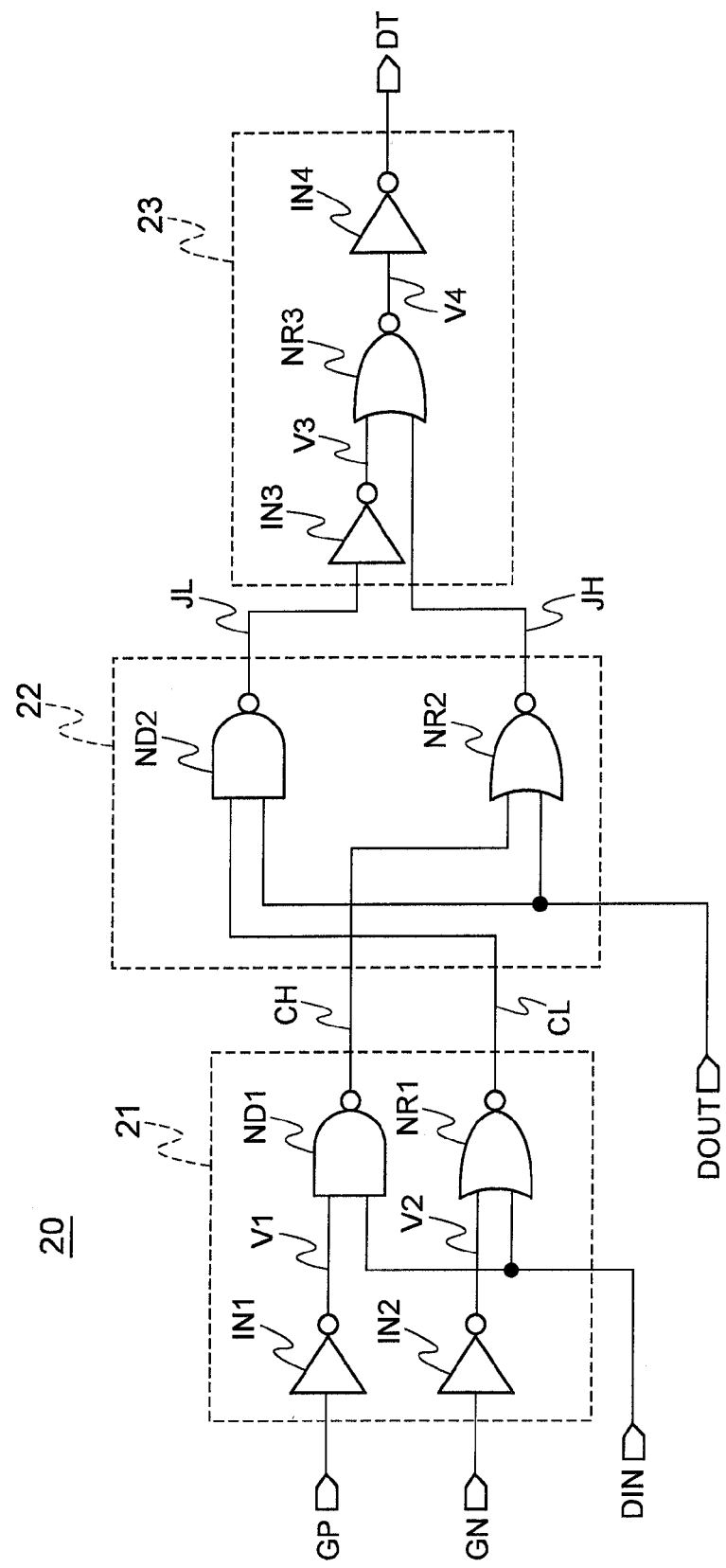
FIG. 2 is a circuit diagram showing the short-circuit detecting circuit.

FIG. 2 is a circuit diagram showing the short-circuit detecting circuit 20.

The comparison pulse generating part 21 is constructed by inverter circuits IN1 and IN2, a NAND circuit ND1, and a NOR circuit NR1.

The Pch-side pulse signal GP is supplied to the inverter circuit IN1. A logical threshold value IN1_th of the inverter circuit IN1 is set to be lower than an intermediate level of an amplitude of the Pch-side pulse signal GP. In other words, the logical threshold value IN1_th is set to be lower than the intermediate level between a power voltage VDD for making the inverter circuit IN1 operative and the ground voltage GND. The logical threshold value IN1_th corresponds to the foregoing low-level generating threshold value. That is, until the signal level of the Pch-side pulse signal GP is lower than the predetermined low-level generating threshold value, an output signal V1 is not outputted from the inverter circuit IN1. The output signal V1 having the pulse width WH corresponding to the period of time during which the signal level of the Pch-side pulse signal GP is lower than the predetermined low-level generating threshold value and the signal level of the amplifier input pulse signal DIN is at the high level is, thus, outputted. The output signal V1 from the inverter circuit IN1 is supplied to the NAND circuit ND1.

The Nch-side pulse signal GN is supplied to the inverter circuit IN2. A logical threshold value IN2_th of the inverter circuit IN2 is set to be higher than an intermediate level of an amplitude of the Nch-side pulse signal GN. In other words, the logical threshold value IN2_th is set to be higher than the intermediate level between the power voltage VDD for making the inverter circuit IN2 operative and the ground voltage GND. The logical threshold value IN2_th corresponds to the foregoing high-level generating threshold value. That is, until the signal level of the Nch-side pulse signal GN exceeds the predetermined high-level generating threshold value, an output signal V2 is not outputted from the inverter circuit IN2. The output signal V2 having the pulse width WL corresponding to the period of time during which the signal level of the Nch-side pulse signal GN is higher than the predetermined high-level generating threshold value and the signal level of the amplifier input pulse signal DIN is at the low level is, thus, outputted. The output signal V2 from the inverter circuit IN2 is supplied to the NOR circuit NR1.

In the NAND circuit ND1, the output signal V1 from the inverter circuit IN1 is supplied to one input and the amplifier input pulse signal DIN is supplied to the other input. The NAND circuit ND1 generates the H-side comparison pulse signal CH. FIG. 3 is a truth value table of the NAND circuit ND1. In the table, H denotes a high-level signal and L indicates a low-level signal. Only when both of the output signal V1 and the amplifier input pulse signal DIN are at the high level, the H-side comparison pulse signal CH of the low level is outputted from the NAND circuit ND1. Since the output signal V1 is a signal having the pulse width WH, the H-side comparison pulse signal CH of the pulse width WH is outputted from the NAND circuit ND1.

In the NOR circuit NR1, the output signal V2 from the inverter circuit IN2 is supplied to one input and the amplifier input pulse signal DIN is supplied to the other input. The NOR circuit NR1 generates the L-side comparison pulse signal CL. FIG. 4 is a truth value table of the NOR circuit NR1. Only when both of the output signal V2 and the amplifier input pulse signal DIN are at the low level, the L-side comparison pulse signal CL of the high level is outputted from the NOR circuit NR1. Since the output signal V2 is a signal having the pulse width WL, the L-side comparison pulse signal CL of the pulse width WL is outputted from the NOR circuit NR1.

The pulse level comparing part 22 is constructed by a NAND circuit ND2 and a NOR circuit NR2.

In the NAND circuit ND2, the L-side comparison pulse signal CL is supplied to one input and the output pulse signal DOUT is supplied to the other input. The NAND circuit ND2 generates the L-side comparison result signal JL. FIG. 5 is a truth value table of the NAND circuit ND2. Only when both of the L-side comparison pulse signal CL and the output pulse signal DOUT are at the high level, the L-side comparison pulse signal CL of the low level is outputted from the NAND circuit ND2.

A logical threshold value ND2_th of the NAND circuit ND2 is set to be lower than an intermediate level of an amplitude of the output pulse signal DOUT. In other words, the logical threshold value ND2_th is set to be lower than an intermediate level between the power voltage VDD2 for making the NAND circuit ND2 operative and the ground voltage GND. The logical threshold value ND2_th corresponds to the foregoing low-side detection threshold value. That is, when the signal level of the output pulse signal DOUT exceeds the predetermined low-side detection threshold value, the L-side comparison result signal JL is outputted. As a result, the detection sensitivity rises for detection of a state when the output short-circuit has occurred at the time of expectation of the low-level output and the signal level has risen.

In the NOR circuit NR2, the H-side comparison pulse signal CH is supplied to one input and the output pulse signal DOUT is supplied to the other input. The NOR circuit NR2 generates the H-side comparison result signal JH. FIG. 6 is a truth value table of the NOR circuit NR2. Only when both of the H-side comparison pulse signal CH and the output pulse signal DOUT are at the low level, the H-side comparison pulse signal CH of the high level is outputted from the NOR circuit NR2.

A logical threshold value NR2_th of the NOR circuit NR2 is set to be higher than an intermediate level of an amplitude of the output pulse signal DOUT. In other words, the logical threshold value NR2_th is set to be higher than an intermediate level between the power voltage VDD2 for making the NOR circuit NR2 operative and the ground voltage GND. The logical threshold value NR2_th corresponds to the foregoing high-side detection threshold value. That is, when the signal level of the output pulse signal DOUT is lower than the predetermined high-side detection threshold value, the L-side comparison result signal JL is outputted. As a result, the detection sensitivity rises for detection of a state when the output short-circuit has occurred at the time of expectation of the high-level output and the signal level has decreased.

The short-circuit detection signal output part 23 is constructed by inverter circuits IN3 and IN4 and a NOR circuit NR3.

The L-side comparison result signal JL is supplied to the inverter circuit IN3 and an output signal V3 in which a signal level of the signal JL has been inverted is outputted.

The output signal V3 is supplied to one input of the NOR circuit NR3 and the H-side comparison result signal JH is supplied to the other input. An output signal V4 is outputted from the NOR circuit NR3.

The output signal V4 is supplied to the inverter circuit IN4 and the short-circuit detection signal DT in which a signal level of the signal V4 has been inverted is outputted from the inverter circuit IN4.

FIG. 7 is a diagram showing a truth value table of the short-circuit detecting circuit 23. When the signal level of the amplifier input pulse signal DIN and the signal level of the output pulse signal DOUT do not coincide, the short-circuit detection signal DT of the high level is outputted from the inverter circuit IN4.

Figure 8:
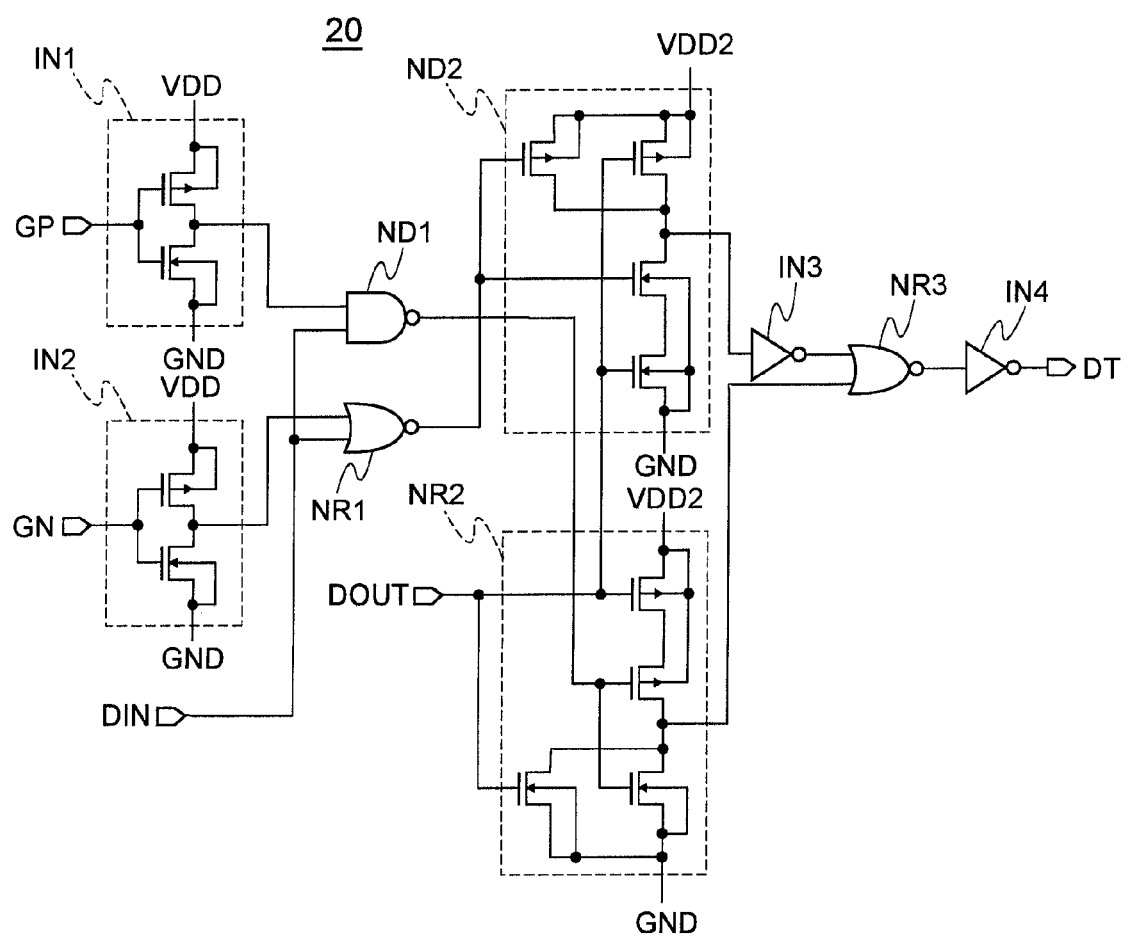
FIG. 8 is a circuit diagram showing inverter circuits IN1 and IN2, the NAND circuit ND2, and the NOR circuit NR2 in detail.

FIG. 8 is a circuit diagram showing the inverter circuits IN1 and IN2, NAND circuit ND2, and NOR circuit NR2 in detail. As shown in the diagram, those circuits can be constructed by, for example, field effect transistors such as PMOS and NMOS. The logical threshold value can be controlled by, for example, adjusting concentration of impurities in a channel region of the transistor. The impurity concentration can be adjusted by the well-known ordinary manufacturing process of transistors. The control method of the threshold voltage is not limited to the method of adjusting the impurity concentration but may be realized by, for example, properly selecting materials and structures of a gate electrode and a gate oxide film. In the case of the control based on the structure, the threshold voltage can be controlled by, for example, adjusting gate lengths and gate widths of the PMOS and NMOS.

Figure 9:
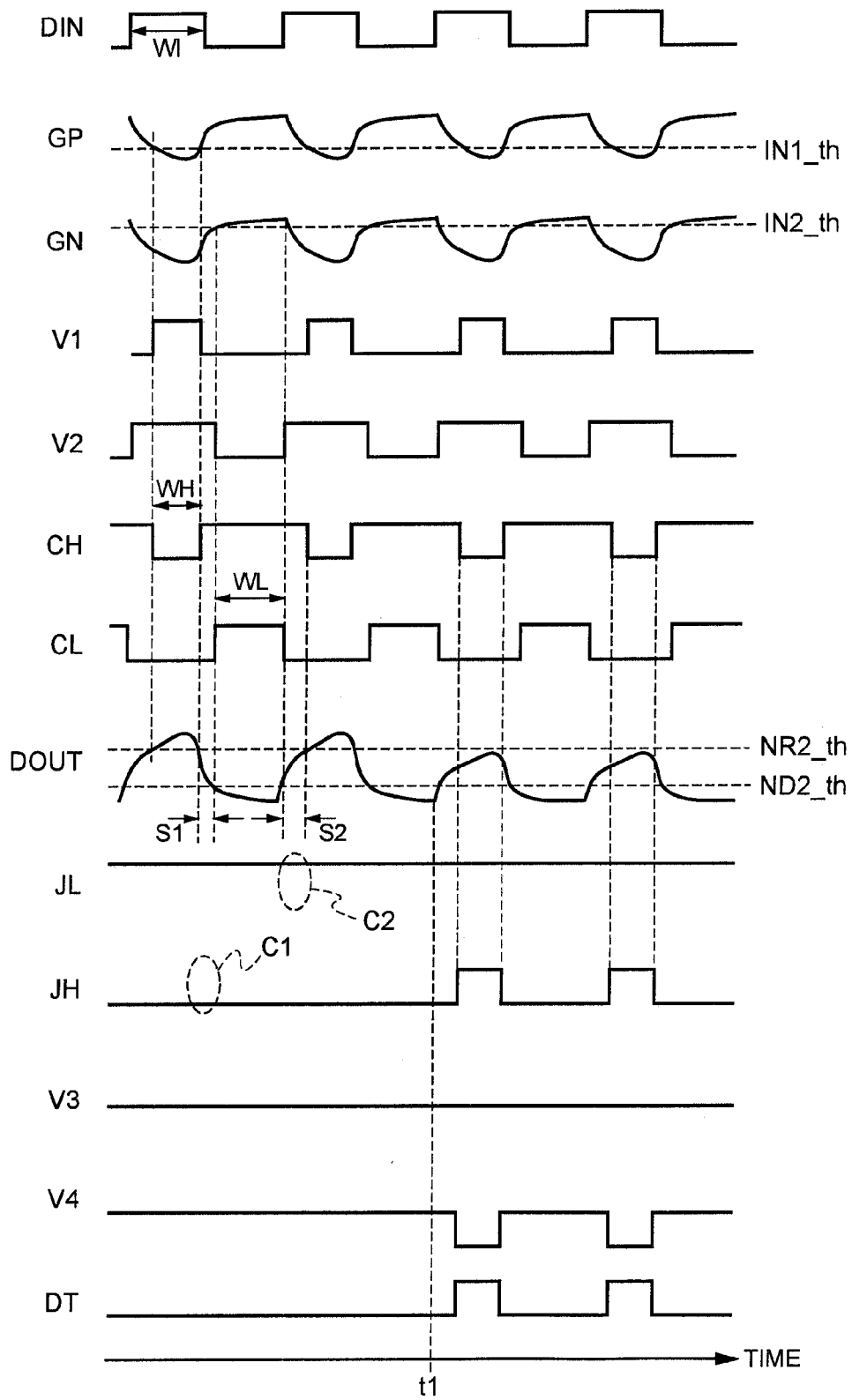
FIG. 9 is a time chart showing each signal in the short-circuit detecting circuit of the first embodiment.

FIG. 9 is a time chart for each signal. The operation of the short-circuit detecting circuit 20 will be described hereinbelow with reference to FIG. 9. It is now assumed that the output is not short-circuited until time t1 but an output short-circuit has occurred at time t1. The short-circuit mentioned here is assumed to be a short-circuit between the output and the ground voltage (ground).

The amplifier input pulse signal DIN used here is a signal in which the high-level pulse and the low-level pulse of a pulse width WI are alternately repeated. The signal level of each of the Pch-side pulse signal GP and the Nch-side pulse signal GN is equal to the level obtained by inverting the amplifier input pulse signal DIN. A pulse width of the Pch-side pulse signal GP and a pulse width of the Nch-side pulse signal GN differ generally. It is, however, not always necessary that the pulse widths of both of those signals are different. A rounding has occurred in each of the leading and trailing edges of both of those signals. The rounding has occurred by charging a capacity of the gate.

The Pch-side pulse signal SP is supplied to the inverter IN1 and the output signal V1 having the pulse width WH corresponding to an interval during which the signal level is lower than the logical threshold value IN1_th is outputted. The Nch-side pulse signal GN is supplied to the inverter IN2 and the output signal V2 having the pulse width WL corresponding to an interval during which the signal level exceeds the logical threshold value IN2_th is outputted. The logical threshold value IN1_th is set to be lower than the intermediate level of the amplitude of the Pch-side pulse signal GP. The logical threshold value IN2_th is set to be higher than the intermediate level of the amplitude of the Pch-side pulse signal GP.

The H-side comparison pulse signal CH having the pulse width WH which is set to the low level only when both of the signal level of the output signal V1 and the signal level of the amplifier input pulse signal DIN are at the high level is outputted from the NAND circuit ND1. The L-side comparison pulse signal CL having the pulse width WL which is set to the high level only when both of the signal level of the output signal V2 and the signal level of the amplifier input pulse signal DIN are at the low level is outputted from the NOR circuit NR1.

Since the class-D amplifier 10 is a buffer, the logical value of the output pulse signal DOUT is the same as the logical value of the amplifier input pulse signal DIN. The rounding, however, has occurred in each of the leading and trailing edges of those signals. After time t1, the high level of the output pulse signal DOUT is reduced to a value lower than that in the normal state due to the output short-circuit.

The L-side comparison result signal JL which is set to the low level only when both of the signal level of the L-side comparison pulse signal CL and the signal level of the output pulse signal DOUT are at the high level is outputted from the NAND circuit ND2. In the interval during which the L-side comparison pulse signal CL is at the high level, that is, in the interval of the pulse width WL, since the signal level of the output pulse signal DOUT is lower than the logical threshold value ND2_th (is at the low level), the signal level of the L-side comparison result signal JL is set to the high level.

The H-side comparison result signal JH which is set to the high level only when both of the signal level of the H-side comparison pulse signal CH and the signal level of the output pulse signal DOUT are at the low level is outputted from the NOR circuit NR2. In the interval during which the H-side comparison pulse signal CH is at the low level before time t1, that is, in the interval of the pulse width WH, since the signal level of the output pulse signal DOUT is higher than the logical threshold value ND2_th (is at the high level), the signal level of the H-side comparison result signal JH is set to the low level. Since the signal level of the output pulse signal DOUT after time t1 is lower than the logical threshold value ND2_th (is at the low level), the signal level of the H-side comparison result signal JH is set to the high level in the interval corresponding to the pulse width WH.

The logical threshold value ND2_th has been set to be lower than the intermediate level of the amplitude of the output pulse signal DOUT and the detecting sensitivity to an increase in signal level due to the output short-circuit at the time of expectation of the low-level output is improved. The logical threshold value NR2_th has been set to be higher than the intermediate level of the amplitude of the output pulse signal DOUT and the detecting sensitivity to a decrease in signal level due to the output short-circuit at the time of expectation of the high-level output is improved.

The output signal V3 from the inverter IN3 is a signal obtained by inverting the signal level of the L-side comparison result signal JL. Since the signal level of the output signal V3 mentioned here is constant at the low level, the output signal V4 from the NOR circuit NR3 is a signal obtained by inverting the signal level of the H-side comparison result signal JH. The short-circuit detection signal DT from the inverter IN4 is a signal obtained by inverting the signal level of the output signal V4. The short-circuit detection signal DT mentioned here is constant at the low level before time t1 and does not detect the output short-circuit. The short-circuit detection signal DT after time t1 is at the high level in the interval corresponding to the pulse width WH and can correctly detect the output short-circuit.

As shown in FIG. 9, the interval corresponding to the pulse width WH is an interval during which the signal level of the output pulse signal DOUT is stable at the high level, and the interval corresponding to the pulse width WL is an interval during which the signal level of the output pulse signal DOUT is stable at the low level. The pulse width WH and the pulse width WL are narrower than the pulse width of the amplifier input pulse signal DIN. The interval corresponding to the pulse width WH and the interval corresponding to the pulse width WL do not overlap mutually and those intervals themselves are not neighboring. An interval S1 or S2 exists between those intervals. The interval S1 is an interval where the signal level of the output pulse signal DOUT has been shifted from the high level to the low level. The interval S2 is an interval where the signal level of the output pulse signal DOUT has been shifted from the low level to the high level.

The reason why the signal levels can be compared only in the interval during which the signal level of the output pulse signal DOUT is stable at the high level or the low level is that the logical threshold value IN1_th of the inverter circuit IN1 has been set to be low and the logical threshold value IN2_th of the inverter circuit IN2 has been set to be high. By setting the logical threshold value as mentioned above, the pulse width WH and the pulse width WL are narrower than the pulse width of the amplifier input pulse signal DIN. The signal level of the output pulse signal DOUT is not compared over the whole interval of the pulse width of the amplifier input pulse signal DIN but the signal levels can be compared in the interval of a part of the pulse width, that is, only in the interval during which the signal level of the output pulse signal DOUT is stable.

Since the signal level of the output pulse signal DOUT and the logical threshold value NR2_th are compared only in the interval corresponding to the pulse width WH and the signal level of the output pulse signal DOUT and the logical threshold value ND2_th are compared only in the interval corresponding to the pulse width WL, the signal level of the H-side comparison result signal JH and the signal level of the L-side comparison result signal JL in the intervals S1 and S2 before time t1 are constant and no pulses are caused (symbols C1 and C2). The short-circuit detection signal DT before time t1 is constant and the erroneous detection of the output short-circuit does not occur.

Figure 10:
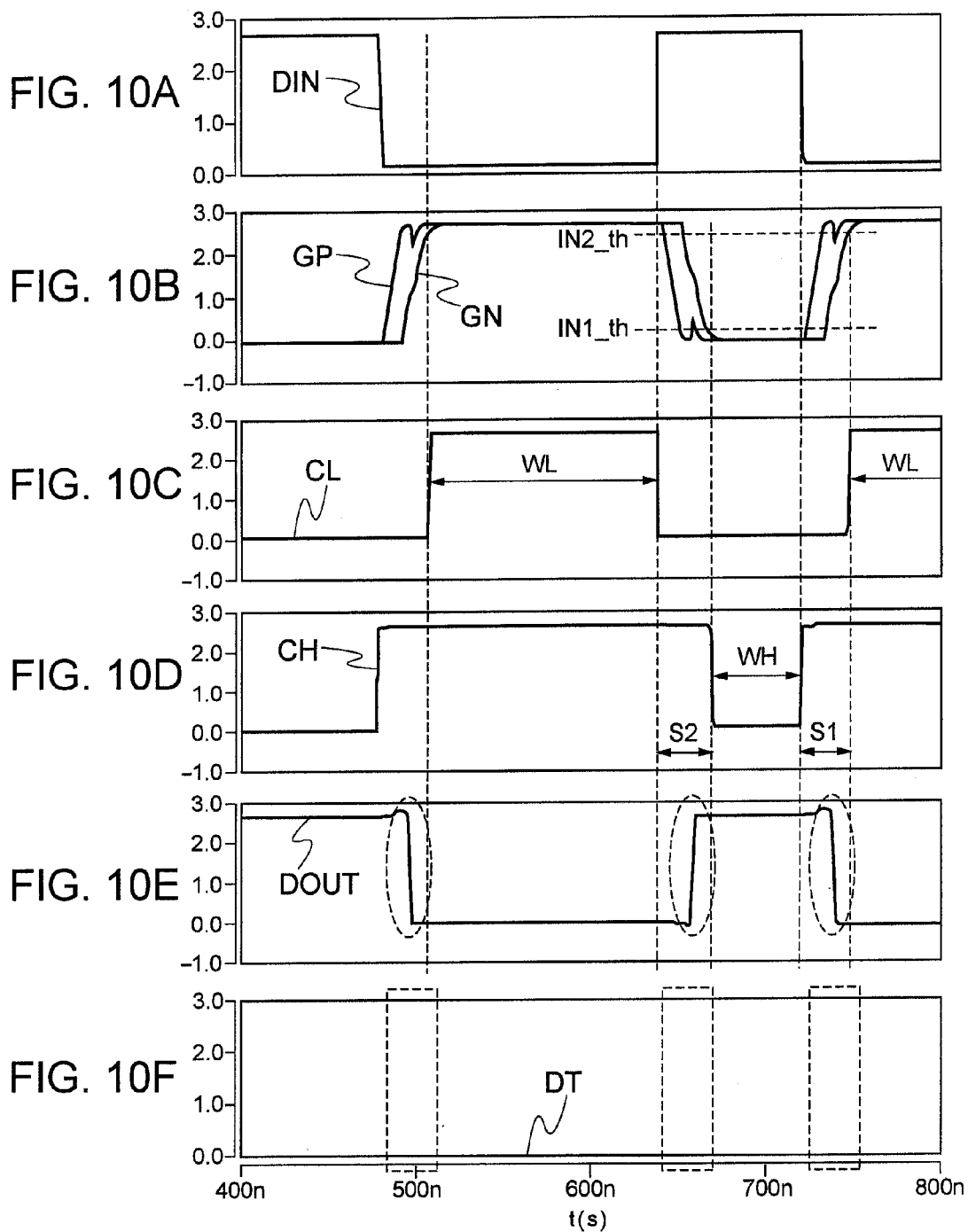
FIGS. 10A to 10F are diagrams showing simulation results of the signals in the short-circuit detecting circuit of the first embodiment.

FIGS. 10A to 10F show simulation waveforms of the signals of the short-circuit detecting circuit 20 according to the embodiment. FIG. 10A shows a simulation result of the amplifier input pulse signal DIN. FIG. 10B shows simulation results of the Pch-side pulse signal GP and the Nch-side pulse signal GN. FIG. 10C shows a simulation result of the L-side comparison pulse signal CL. FIG. 10D shows a simulation result of the H-side comparison pulse signal CH. FIG. 10E shows a simulation result of the output pulse signal DOUT. FIG. 10F shows a simulation result of the short-circuit detection signal DT.

It is determined that the signal level of the Nch-side pulse signal GN has been stabilized to the low level by setting the logical threshold value IN1_th in FIG. 10B to be low. It is determined that the signal level of the Pch-side pulse signal GP has been stabilized to the high level by setting the logical threshold value IN2_th in FIG. 10B to be high. The interval corresponding to the pulse width WL is an interval for detecting the output short-circuit at the time of expectation of the low-level output. The interval corresponding to the pulse width WH is an interval for detecting the output short-circuit at the time of expectation of the high-level output. The intervals S1 and S2 are intervals during which the output short-circuit is not detected. As shown by broken lines in FIG. 10E, the signal level of the output pulse signal DOUT is shifted from the high level to the low level in the interval S1 and is shifted from the low level to the high level in the interval S2. As shown by broken lines in FIG. 10F, however, the output short-circuit is not detected in those intervals. As mentioned above, it has been confirmed by the simulation that the output short-circuit is not erroneously detected in the interval during which the signal level of the output pulse signal DOUT is shifted.

As mentioned above, according to the short-circuit detecting circuit of the embodiment, by setting one of the logical threshold values of the inverters IN1 and IN2 in each of which the input pulse signal to the output buffer of the class-D amplifying circuit is used as an input to be high and by setting the other to be low, the signal level of the output pulse signal DOUT is detected only in the interval during which the signal level of the output pulse signal DOUT has been stabilized to the high level or the low level. The erroneous detection of the output short-circuit, therefore, in the transition interval of the signal level can be prevented. By using the two logical threshold values in which one of them has been set to be high and the other has been set to be low in order to compare the signal level of the output pulse signal DOUT, the detecting sensitivity at the time of occurrence of the output short-circuit can be improved. Since the short-circuit detecting circuit of the embodiment is a simple circuit constructed by the inverters and the like without using a clock signal, a counter circuit, or the like, a chip area is not increased.

As mentioned above, according to the short-circuit detecting circuit of the embodiment, the output short-circuit of the amplifying circuit can be accurately detected by the simple circuit construction.

Second Embodiment

A construction of the short-circuit detecting circuit 20 according to the second embodiment is substantially the same as that of the first embodiment. By adjusting the logical threshold values of the inverter IN3 and the like constructing the short-circuit detection signal output part 23, the output short-circuit can be accurately detected even when the pulse width of the amplifier input pulse signal DIN is extremely short. Specifically speaking, the logical threshold values are set as follows.

A logical threshold value IN3_th of the inverter IN3 is set to be lower than the intermediate level of the amplitude of the L-side comparison result signal JL. A logical threshold value NR3_th of the NOR circuit NR3 is set to be higher than the intermediate level of the amplitude of the output signal V3. A logical threshold value IN4_th of the inverter IN4 is set to be lower than the intermediate level of the amplitude of the output signal V4.

Figure 11:
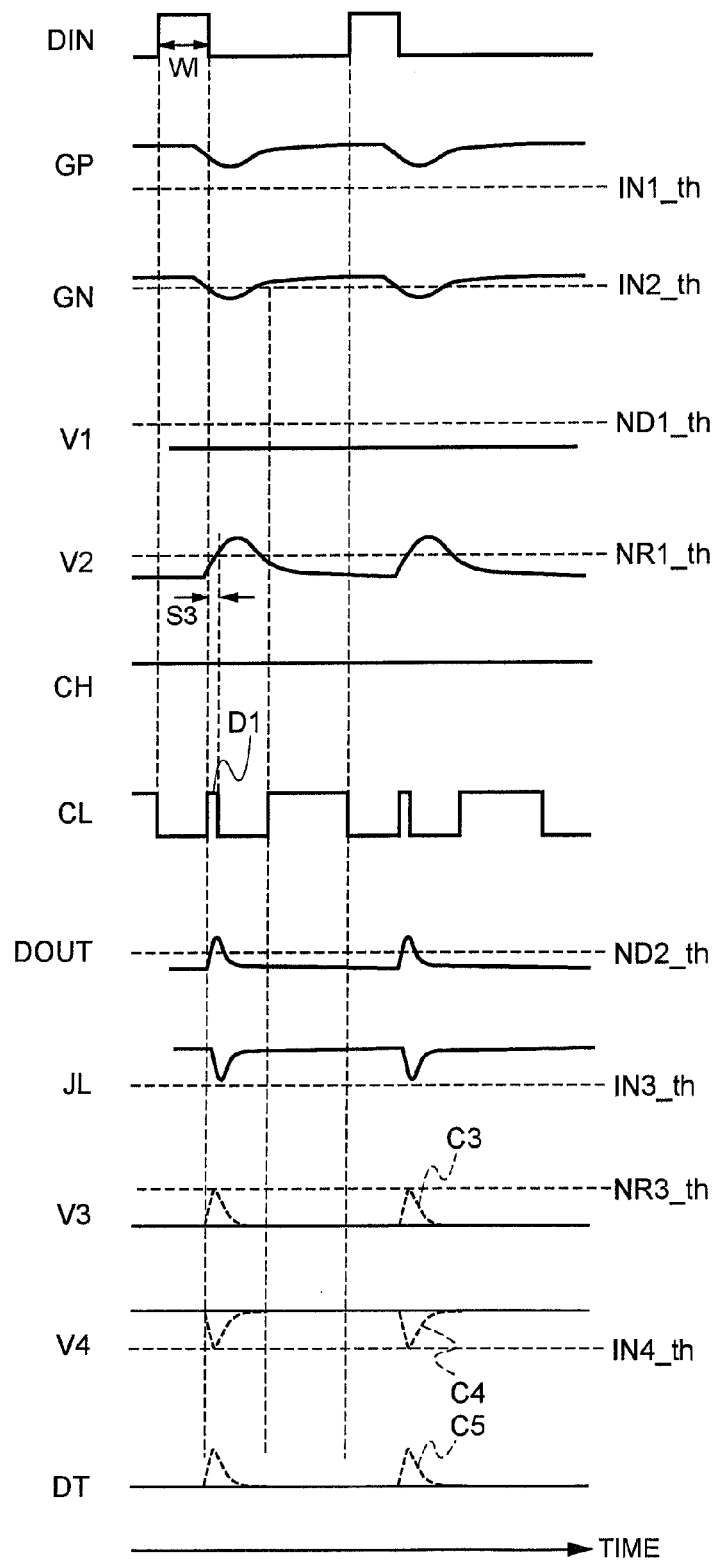
FIG. 11 is a time chart showing each signal in a short-circuit detecting circuit of the second embodiment.

An effect which is obtained when the values have been set as mentioned above will be described hereinbelow with reference to FIG. 11 as a time chart showing each signal of the short-circuit detecting circuit 20.

The pulse width WI of the amplifier input pulse signal DIN is extremely narrower than that in the normal state. In the case, the amplitudes of the Pch-side pulse signal GP and the Nch-side pulse signal GN are small.

Since the signal level of the Pch-side pulse signal GP does not reach the logical threshold value IN1_th which has been set to a relatively low value, the output signal V1 from the inverter circuit IN1 is constant at the low level. Since the output signal V1 is constant at the low level, the H-side comparison pulse signal CH is constant at the high level.

Since the signal level of the Nch-side pulse signal GN reaches the logical threshold value IN2_th which has been set to a relatively high value, the output signal V2 from the inverter circuit IN2 becomes the pulse signal. The NOR circuit NR3 generates the L-side comparison pulse signal CL which is set to the high level in the case where the signal level of the output signal V2 and the signal level of the amplifier input pulse signal DIN are at the low level. In an interval S3, the signal level of the amplifier input pulse signal DIN is at the low level and the signal level of the output signal V2 is lower than the logical threshold value NR1_th, that is, the low level. In spite of a fact that the output short-circuit does not actually occur, therefore, a high-level pulse D1 having a pulse width corresponding to the interval S3 is generated.

Since the pulse width WI of the amplifier input pulse signal DIN is narrow, although the amplitude of the output pulse signal DOUT is small, the amplitude of a certain value exceeding the logical threshold value ND2_th appears. The signal level of the output pulse signal DOUT in the interval over the logical threshold value ND2_th is at the high level. The NAND circuit ND2 outputs the low-level L-side comparison result signal JL in the case where the signal level of the H-side comparison pulse signal CH and the signal level of the output pulse signal DOUT are at the high level.

The logical threshold value IN3_th of the inverter IN3 is set to such a low value that in the case where the amplitude of the L-side comparison result signal JL is insufficient, its signal level does not reach the logical threshold value IN3_th. Since the signal level of the L-side comparison result signal JL does not reach the logical threshold value IN3_th, the signal level of the output signal V3 from the inverter IN3 is constant at the low level. A pulse C3 as shown by a broken line is, therefore, not generated.

The logical threshold value NR3_th of the NOR circuit NR3 is set to such a high value that in the case where the amplitude of the output signal V3 is insufficient, its signal level does not reach the logical threshold value NR3_th. Since the signal level of the output signal V3 does not reach the logical threshold value NR3_th, the signal level of the output signal V4 from the NOR circuit NR3 is constant at the high level. A pulse C4 as shown by a broken line is, therefore, not outputted.

The logical threshold value IN4_th of the inverter IN4 is set to such a low value that in the case where the amplitude of the output signal V4 is insufficient, its signal level does not reach the logical threshold value IN4_th. Since the signal level of the output signal V4 does not reach the logical threshold value IN4_th, the signal level of the short-circuit detection signal DT from the inverter IN4 is constant at the low level. A pulse C5 as shown by a broken line is, therefore, not outputted.

FIGS. 12A to 12F are diagrams showing simulation results of the signals in the short-circuit detecting circuit. FIG. 12A shows the simulation result of the amplifier input pulse signal DIN. FIG. 12B shows simulation results of the Pch-side pulse signal SP and the Nch-side pulse signal GN. FIG. 12C shows a simulation result of the output signal V2. FIG. 12D shows simulation results of the L-side comparison pulse signal CL and the output pulse signal DOUT. FIG. 12E shows a simulation result of the L-side comparison result signal JL. FIG. 12F shows a simulation result of the short-circuit detection signal DT.

Since the pulse width of the amplifier input pulse signal DIN in FIG. 12A is narrow, the sufficient amplitudes of the Pch-side pulse signal GP and the Nch-side pulse signal GN in FIG. 12B do not appear. Although the signal level of the Pch-side pulse signal GP does not reach the logical threshold value IN1_th, the signal level of the Nch-side pulse signal GN has reached the logical threshold value IN2_th. The pulse of the high level is, therefore, generated in the output signal V2 in FIG. 12C. The signal level of the output signal V2 is lower than the logical threshold value NR1_th, that is, the low level. The high-level pulse of the pulse width corresponding to the interval S3 during which the amplifier input pulse signal DIN is at the low level is generated in the L-side comparison pulse signal CL in FIG. 12D.

Since the output pulse signal DOUT is also at the high level in the interval S3, the low-level pulse is generated in the L-side comparison result signal JL in FIG. 12E. Since the signal level of the L-side comparison result signal JL does not reach the logical threshold value IN3_th, the short-circuit detection signal DT in FIG. 12F is constant at the low level. Since the logical threshold value NR3_th of the NOR circuit NR3 and the logical threshold value IN4_th of the inverter IN4 have been also set and adjusted, the short-circuit detection signal DT is also constant at the low level owing to their effects. As mentioned above, it has been confirmed by the simulation that the output short-circuit is not erroneously detected even in the case where the pulse width of the amplifier input pulse signal DIN is extremely short.

As mentioned above, according to the short-circuit detecting circuit of the embodiment, in the case where the amplitude of the signal from the pulse level comparing part 22 at the front stage is insufficient, the logical threshold values of the inverters and the like constructing the short-circuit detection signal output part 23 are set to such a level that does not reach the threshold value. In the case where the pulse width of the amplifier input pulse signal DIN is extremely short and the sufficient amplitude does not appear, the erroneous detection of the output short-circuit can be also prevented.

As mentioned above, according to the short-circuit detecting circuit of the embodiment, even in the case where the pulse width of the amplifier input pulse signal DIN is extremely short, the output short-circuit of the amplifying circuit can be accurately detected by the simple circuit construction.

Figure 13A:
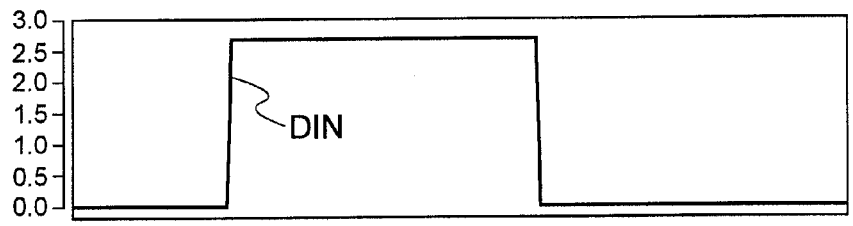
FIGS. 13A to 13E are diagrams showing simulation results of the signals in the short-circuit detecting circuit of the second embodiment in the case where the pulse width of the amplifier input pulse signal DIN is long.
Figure 13B:
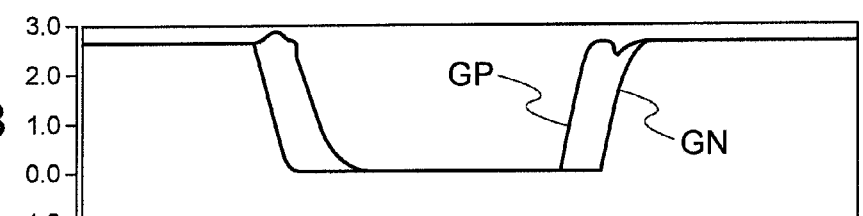
Figure 13C:
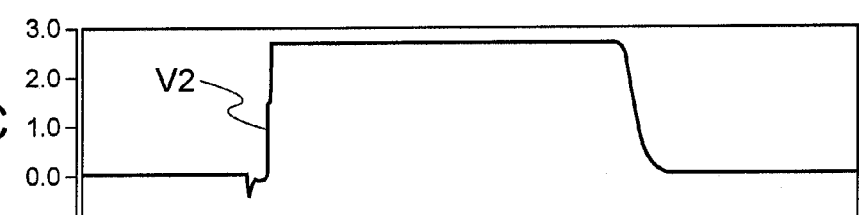
Figure 13D:
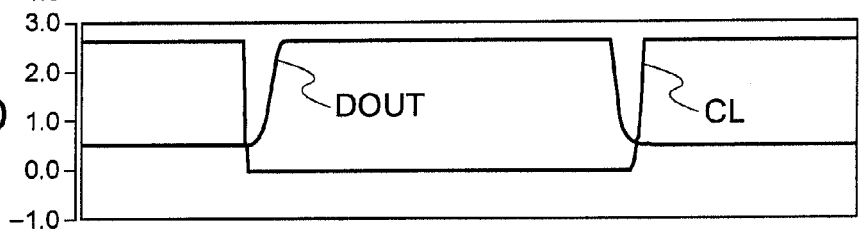
Figure 13E:
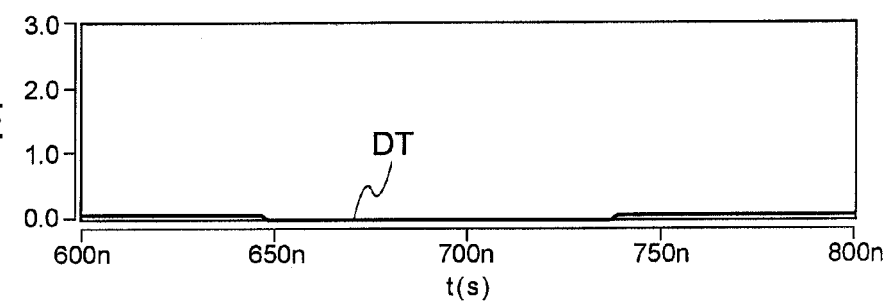

FIGS. 13A to 13E are diagrams showing simulation results of the signals in the short-circuit detecting circuit in the case where the pulse width of the amplifier input pulse signal DIN is long. FIG. 13A shows the simulation result of the amplifier input pulse signal DIN. FIG. 13B shows simulation results of the Pch-side pulse signal GP and the Nch-side pulse signal GN. FIG. 13C shows a simulation result of the output signal V2. FIG. 13D shows simulation results of the L-side comparison pulse signal CL and the output pulse signal DOUT. FIG. 13E shows a simulation result of the short-circuit detection signal DT. As shown in FIG. 13E, it has been confirmed that the erroneous detection of the output short-circuit does not occur even in the case where the pulse width of the amplifier input pulse signal DIN is long.

Third Embodiment

A construction of the short-circuit detecting circuit 20 according to the third embodiment is substantially the same as that of the first embodiment. By adjusting the logical threshold values of the NAND circuit ND1 and the NOR circuit NR1 included in the comparison pulse generating part 21, even when the pulse width of the amplifier input pulse signal DIN is extremely short, the output short-circuit can be accurately detected. Specifically speaking, the logical threshold values are set as follows.

A logical threshold value ND1_th of the NAND circuit ND1 is set to be higher than the intermediate level of the amplitude of the output signal V1. The logical threshold value NR1_th of the NOR circuit NR1 is set to be lower than the intermediate level of the amplitude of the output signal V2.

Figure 14:
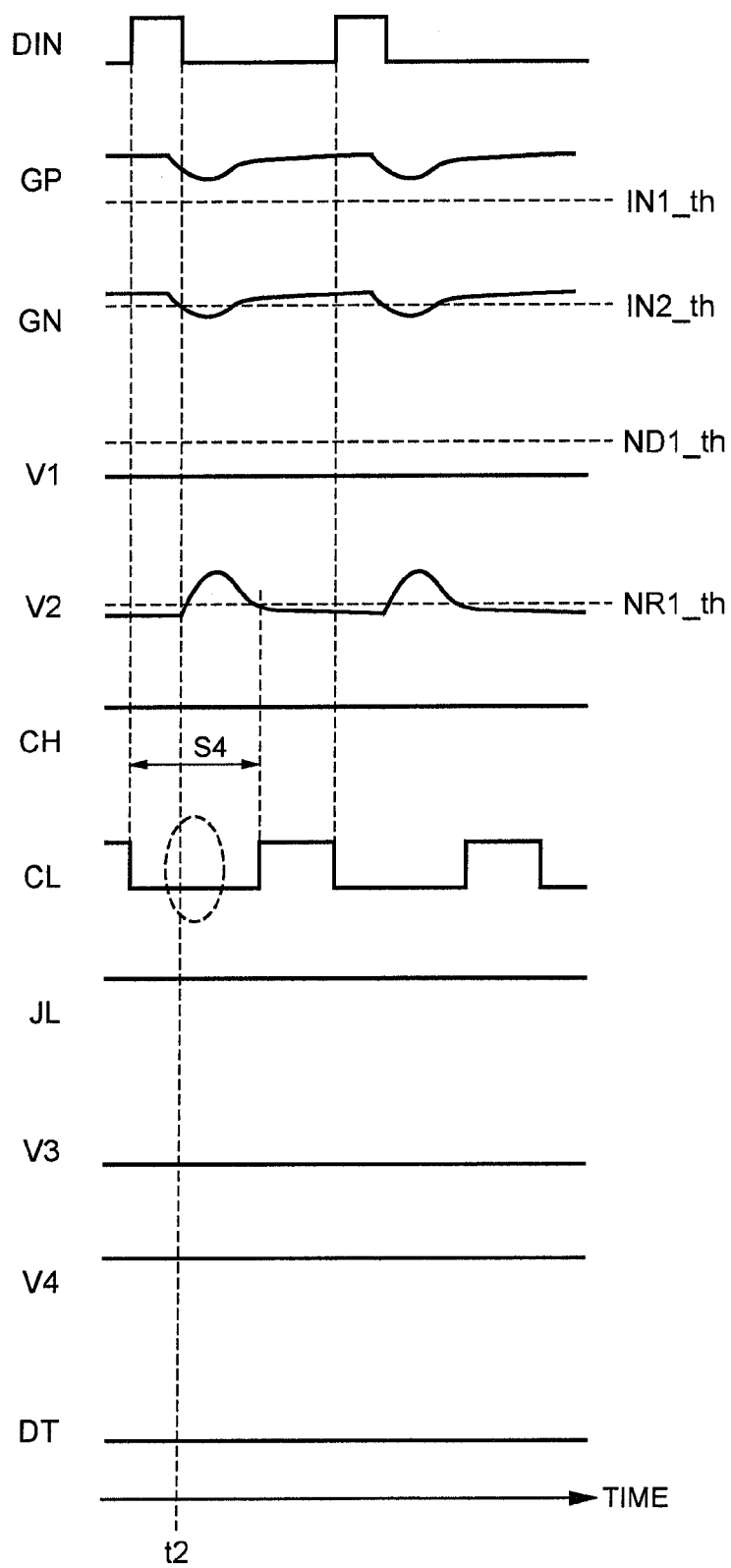
FIG. 14 is a time chart showing each signal in a short-circuit detecting circuit of the third embodiment.

An effect which is obtained when the values have been set as mentioned above will be described hereinbelow with reference to FIG. 14 as a time chart showing each signal of the short-circuit detecting circuit 20.

The pulse width WI of the amplifier input pulse signal DIN is extremely narrower than that in the normal state and the amplitudes of the Pch-side pulse signal GP and the Nch-side pulse signal GN are small.

Since the signal level of the Pch-side pulse signal GP does not reach the logical threshold value IN1_th which has been set to a relatively low value, the output signal V1 from the inverter circuit IN1 is constant at the low level. Since the output signal V1 is constant at the low level, the H-side comparison pulse signal CH is constant at the high level.

Since the signal level of the Nch-side pulse signal GN reaches the logical threshold value IN2_th which has been set to a relatively high value, the output signal V2 from the inverter circuit IN2 becomes the pulse signal. The signal level of the output signal V2 is higher than the logical threshold value NR1_th which has been set to the relatively low value at a point of time t2. In the interval S4, unlike the second embodiment, since both of the signal level of the amplifier input pulse signal DIN and the signal level of the Nch-side pulse signal GN are not set to the low level, the high-level pulse is not generated in the L-side comparison pulse signal CL (portion shown by an ellipse of a broken line).

The signal level of each of the L-side comparison result signal JL and the output signals V3 and V4, therefore, becomes constant. The short-circuit detection signal DT is also constant at the low level and the output short-circuit is not erroneously detected.

FIGS. 15A to 15E are diagrams showing simulation results of the signals in the short-circuit detecting circuit 20 according to the third embodiment. FIG. 15A shows the simulation result of the amplifier input pulse signal DIN. FIG. 15B shows simulation results of the Pch-side pulse signal GP and the Nch-side pulse signal GN. FIG. 15C shows simulation results of the L-side comparison pulse signal CL and the output pulse signal DOUT. FIG. 15D shows a simulation result of the L-side comparison result signal JL. FIG. 15E shows a simulation result of the short-circuit detection signal DT.

Unlike the second embodiment, no pulse is generated in the L-side comparison pulse signal CL in the interval S4 in FIG. 15C. In association with it, the signal level of the L-side comparison result signal JL in FIG. 15D is almost constant at the high level and the signal level of the short-circuit detection signal DT in FIG. 15E is constant at the low level. As mentioned above, even in the short-circuit detecting circuit 20 according to the embodiment, it has been confirmed by the simulation that the output short-circuit is not erroneously detected even in the case where the pulse width of the amplifier input pulse signal DIN is extremely short.

As mentioned above, according to the short-circuit detecting circuit of the embodiment, by adjusting the logical threshold values of the NAND circuit and the NOR circuit included in the comparison pulse generating part 21, the H-side comparison pulse signal CH and the L-side comparison pulse signal CL each of which does not include unnecessary pulses can be formed. Even in the case where the pulse width of the amplifier input pulse signal DIN is extremely short and the sufficient amplitude does not appear, consequently, the erroneous detection of the output short-circuit can be prevented.

As mentioned above, according to the short-circuit detecting circuit of the embodiment, even in the case where the pulse width of the amplifier input pulse signal DIN is extremely short, the output short-circuit of the amplifying circuit can be accurately detected by the simple circuit construction.

This application is based on Japanese Patent Application No. 2008-193666 which is incorporated herein by reference.

What is claimed is:

1. A short-circuit detecting circuit for detecting an output short-circuit of a class-D amplifier including an output stage input pulse signal generating part for generating two output stage input pulse signals on the basis of an amplifier input pulse signal and an output part for generating an output pulse signal on the basis of inputs of said two output stage input pulse signals, comprising:
   a comparison pulse generating part for comparing a signal level of one of said two output stage input pulse signals with a high-level generating threshold value and comparing a signal level of the other one of said two output stage input pulse signals with a low-level generating threshold value, thereby generating two comparison pulse signals;
   a pulse level comparing part for comparing a signal level of the output pulse signal from said class-D amplifier within a period of time corresponding to a pulse width of each of said two comparison pulse signals with a high-side detection threshold value and a low-side detection threshold value, thereby obtaining level comparison results; and
   a short-circuit detection signal output part for generating a short-circuit detection signal in accordance with said level comparison results.

2. The circuit recited in claim 1, wherein said comparison pulse generating part generates a pulse signal of a pulse width corresponding to a period of time during which the signal level of said output stage input pulse signal exceeds said high-level generating threshold value as one of said two comparison pulse signals and generates a pulse signal of a pulse width corresponding to a period of time during which the signal level of said output stage input pulse signal is lower than said low-level generating threshold value as the other one of said two comparison pulse signals.

3. The circuit recited in claim 2, wherein
   said comparison pulse generating part includes two inverter circuits,
   said high-level generating threshold value is a logical threshold value of one of said inverter circuits, and said low-level generating threshold value is a logical threshold value of the other one of said inverter circuits.

4. The circuit recited in claim 3, wherein
   said two inverter circuits comprise field effect transistors, and
   said logical threshold value is a logical threshold value of a gate of said field effect transistor.

5. The circuit recited in claim 3, wherein the logical threshold value of one of said inverter circuits is set to be higher than an intermediate level of an amplitude of said output stage input pulse signal, and the logical threshold value of the other one of said inverter circuits is set to be lower than the intermediate level of the amplitude of said output stage input pulse signal.

6. The circuit recited in claim 1, wherein
   said pulse level comparing part compares the signal level of said output pulse signal with said high-side detection threshold value within the period of time corresponding to the pulse width of one of said comparison pulse signals and compares the signal level of said output pulse signal with said low-side detection threshold value within the period of time corresponding to the pulse width of the other one of said comparison pulse signals, and
   said short-circuit detection signal output part generates said short-circuit detection signal in the case where the signal level of said output pulse signal is lower than said high-side detection threshold value and in the case where the signal level of said output pulse signal exceeds said low-side detection threshold value.

7. The circuit recited in claim 6, wherein said pulse level comparing part comprises:
   a NOR circuit in which one input is said output pulse signal, the other input is one of said comparison pulse signals, and an output is said level comparison result; and
   a NAND circuit in which one input is said output pulse signal, the other input is the other one of said comparison pulse signals, and an output is said level comparison result,
   said high-side detection threshold value is a logical threshold value of said NOR circuit, and said low-side detection threshold value is a logical threshold value of said NAND circuit.

8. The circuit recited in claim 7, wherein
   each of said NOR circuit and said NAND circuit comprises a field effect transistor, and
   said logical threshold value is a logical threshold value of a gate of said field effect transistor.

9. The circuit recited in claim 7, wherein said high-side detection threshold value is set to be higher than an intermediate level of an amplitude of said output pulse signal, and said low-side detection threshold value is set to be lower than the intermediate level of the amplitude of said output pulse signal.

10. The circuit recited claim 1, wherein said short-circuit detection signal output part generates said short-circuit detection signal in accordance with a comparison result of a signal level of a signal showing said level comparison result and a predetermined output level threshold value.

11. The circuit recited in claim 10, wherein said short-circuit detection signal output part comprises:
   a first inverter circuit in which an input is the signal showing said level comparison result;
   a NOR circuit in which one input is the signal showing said level comparison result and the other input is an output signal from said first inverter circuit; and
   a second inverter circuit in which an input is an output signal from said NOR circuit and an output is said short-circuit detection signal, and
   said output level threshold value is a logical threshold value of each of said first and second inverter circuits and said NOR circuit.

12. The circuit recited claim 11, wherein each of said first and second inverter circuits and said NOR circuit comprises a field effect transistor, and
   said logical threshold value is a logical threshold value of a gate of said field effect transistor.

13. The circuit recited in claim 11, wherein the logical threshold value of each of said first and second inverter circuits is set to be lower than an intermediate level of an amplitude of the signal showing said level comparison result, and the logical threshold value of said NOR circuit is set to be higher than an intermediate level of the amplitude of the signal showing said level comparison result.

14. The circuit recited in claim 1, wherein the intervals corresponding to the pulse widths of said two comparison pulse signals do not overlap and said intervals are not neighboring.

15. The circuit recited in claim 14, wherein the interval corresponding to the pulse width of each of said two comparison pulse signals is an interval during which the signal level of said output pulse signal is stable, and an interval between said intervals is an interval during which the signal level of said output pulse signal has been shifted.

16. The circuit recited in claim 14, wherein the pulse width of each of said two comparison pulse signals is narrower than a pulse width of said output stage input pulse signal.

17. The circuit recited in claim 1, wherein said output part is an inverter of a CMOS comprising a PMOS and an NMOS, one of said two output stage input pulse signals is supplied to a gate of said PMOS, the other one of said two output stage input pulse signals is supplied to a gate of said NMOS, and said output stage input pulse signal is outputted from a connecting point of a drain of said PMOS and a drain of said NMOS.

* * * * *